United States Patent
Marion et al.

(10) Patent No.: US 9,530,626 B2
(45) Date of Patent: Dec. 27, 2016

(54) METHOD AND APPARATUS FOR ESC CHARGE CONTROL FOR WAFER CLAMPING

(71) Applicant: TOKYO ELECTRON LIMITED, Tokyo (JP)

(72) Inventors: Jason Marion, Glenville, NY (US); Sonam Sherpa, Fishkill, NY (US); Sergey A. Voronin, Delmar, NY (US); Alok Ranjan, Mechanicville, NY (US); Yoshio Ishikawa, Miyagi (JP); Takashi Enomoto, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/807,319

(22) Filed: Jul. 23, 2015

(65) Prior Publication Data
US 2016/0027620 A1 Jan. 28, 2016

Related U.S. Application Data

(60) Provisional application No. 62/028,919, filed on Jul. 25, 2014.

(51) Int. Cl.
*C03C 15/00* (2006.01)
*H01J 37/32* (2006.01)
*H01L 21/683* (2006.01)

(52) U.S. Cl.
CPC .... *H01J 37/32697* (2013.01); *H01J 37/32422* (2013.01); *H01J 37/32706* (2013.01); *H01J 37/32715* (2013.01); *H01L 21/6833* (2013.01)

(58) Field of Classification Search
CPC ............... H01J 37/32697; H01J 37/32082; H01J 37/32192
(Continued)

(56) References Cited

U.S. PATENT DOCUMENTS 5,684,669 A * 11/1997 Collins ............... H01L 21/6831
361/234
6,375,860 B1 * 4/2002 Ohkawa ............... C23C 16/4401
118/723 E
(Continued)

FOREIGN PATENT DOCUMENTS

EP 0 971 391 A2 1/2000
JP 2005-64234 A 3/2005
(Continued)

OTHER PUBLICATIONS

Office Action mailed Jul. 5, 2016 in corresponding Japanese Patent Application No. 2015-146714 (with an English translation) (10 pages).

(Continued)

*Primary Examiner* — Duy Deo
*Assistant Examiner* — Maki Angadi
(74) *Attorney, Agent, or Firm* — Rothwell, Figg, Ernst & Manbeck, P.C.

(57) ABSTRACT

A plasma processing method and apparatus are provided in which current spikes associated with application of a voltage to an electrostatic chuck (ESC) are minimized or reduced when the processing plasma is present. According to an example, the voltage is applied to the ESC after the processing plasma is struck, however the voltage is ramped or increased in a step-wise manner to achieve the desired final ESC voltage. In an alternate embodiment, the ESC voltage is at least partially applied before striking of the plasma for processing the wafer. By reducing current spikes associated with application of the voltage to the ESC during the presence of the processing plasma, transfer or deposition of particles on the wafer can be reduced.

20 Claims, 10 Drawing Sheets

(58) Field of Classification Search
USPC .......................... 216/37, 68, 73, 69; 361/234
See application file for complete search history.

(56) References Cited

U.S. PATENT DOCUMENTS

| | | | |
|---|---|---|---|
| 6,898,065 B2 * | 5/2005 | Mays | ................ H01L 21/6833 |
| | | | 361/234 |
| 7,838,800 B2 | 11/2010 | Tsukamoto | |
| 8,982,529 B2 | 3/2015 | Kobayashi | |
| 2007/0217118 A1 * | 9/2007 | Ikuhara | ................ H02N 13/00 |
| | | | 361/234 |
| 2010/0055879 A1 | 3/2010 | Harano et al. | |
| 2015/0009602 A1 * | 1/2015 | Adachi | ............. H01L 21/67248 |
| | | | 361/234 |

FOREIGN PATENT DOCUMENTS

| | | |
|---|---|---|
| JP | 2012-174978 A | 9/2012 |
| KR | 10-2013-0038199 A | 4/2013 |
| TW | 417146 B | 1/2001 |
| TW | 1323916 B | 4/2010 |
| TW | 201021103 A1 | 6/2010 |

OTHER PUBLICATIONS

Office Action mailed Jul. 12, 2016 in corresponding Korean Patent Application No. 10-2015-0105983 (with an English translation) (19 pages).

Notification of Examination Opinions mailed Oct. 12, 2016 in corresponding Taiwan Patent Application No. 104123995 (with an English translation) (21 pages).

* cited by examiner

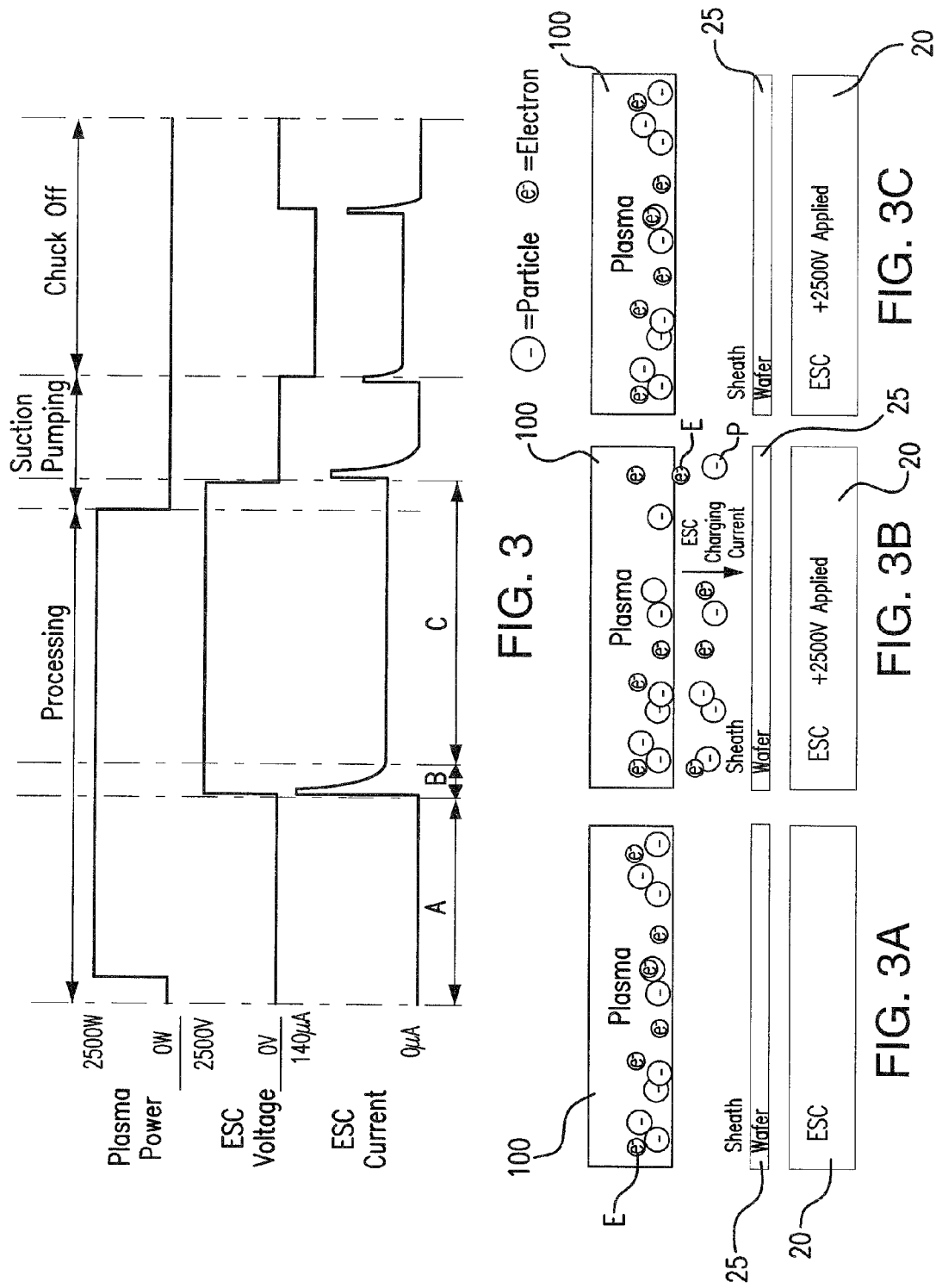

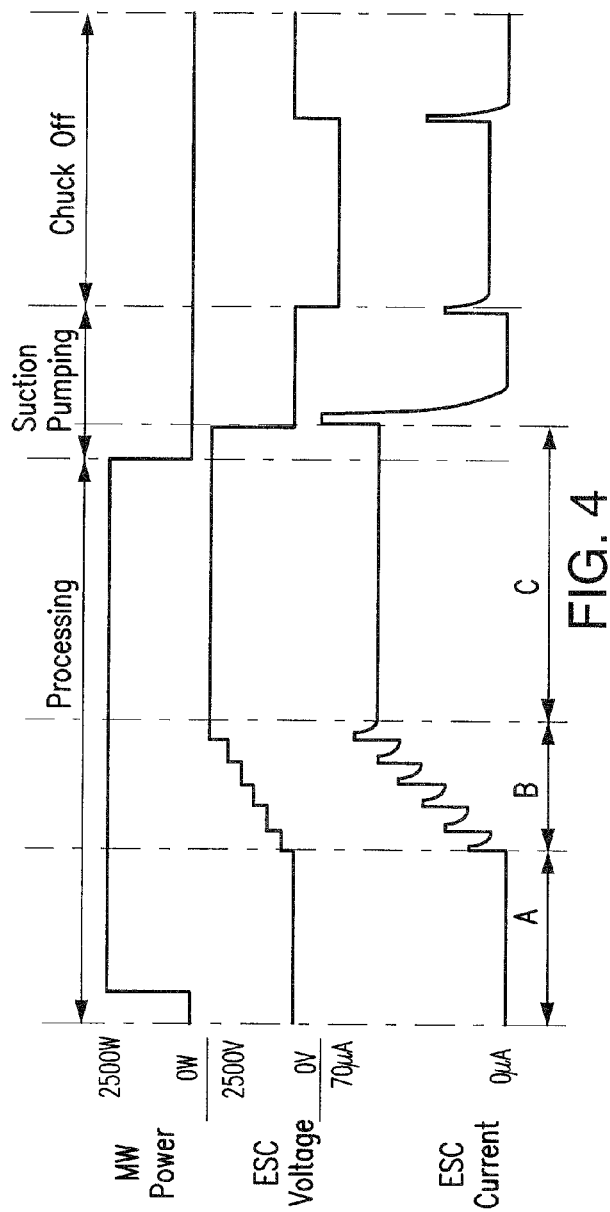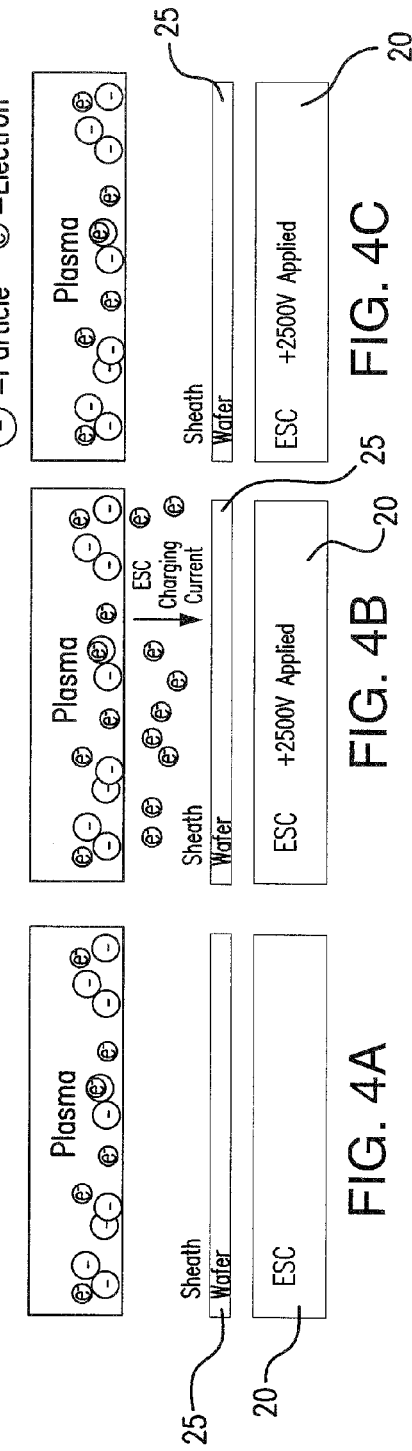

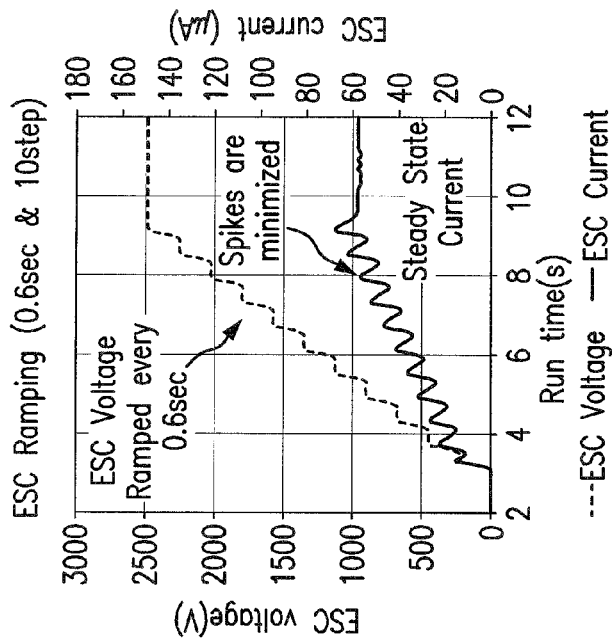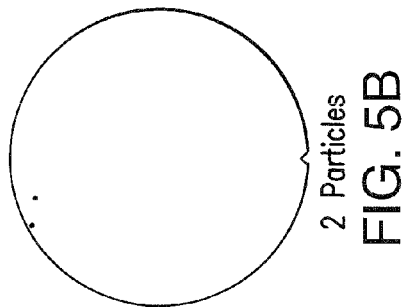
2 Particles  
FIG. 5B
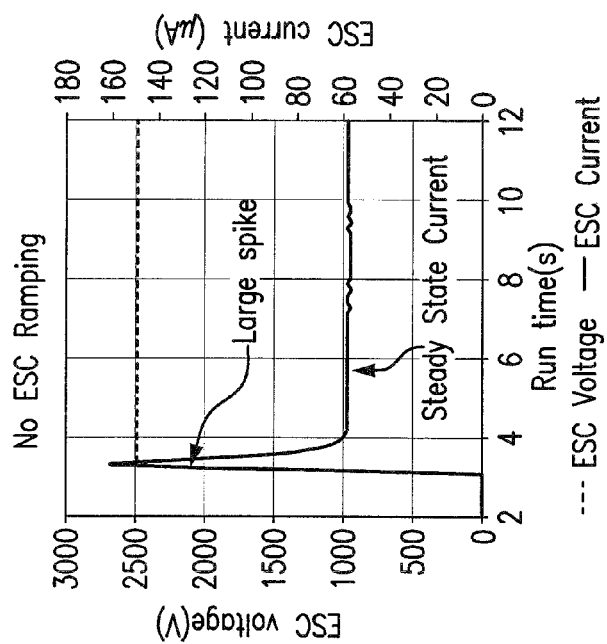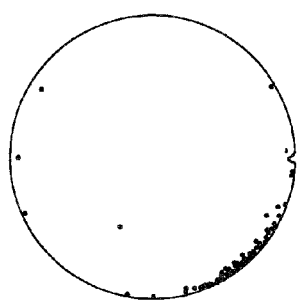
247 Particles  
FIG. 5A

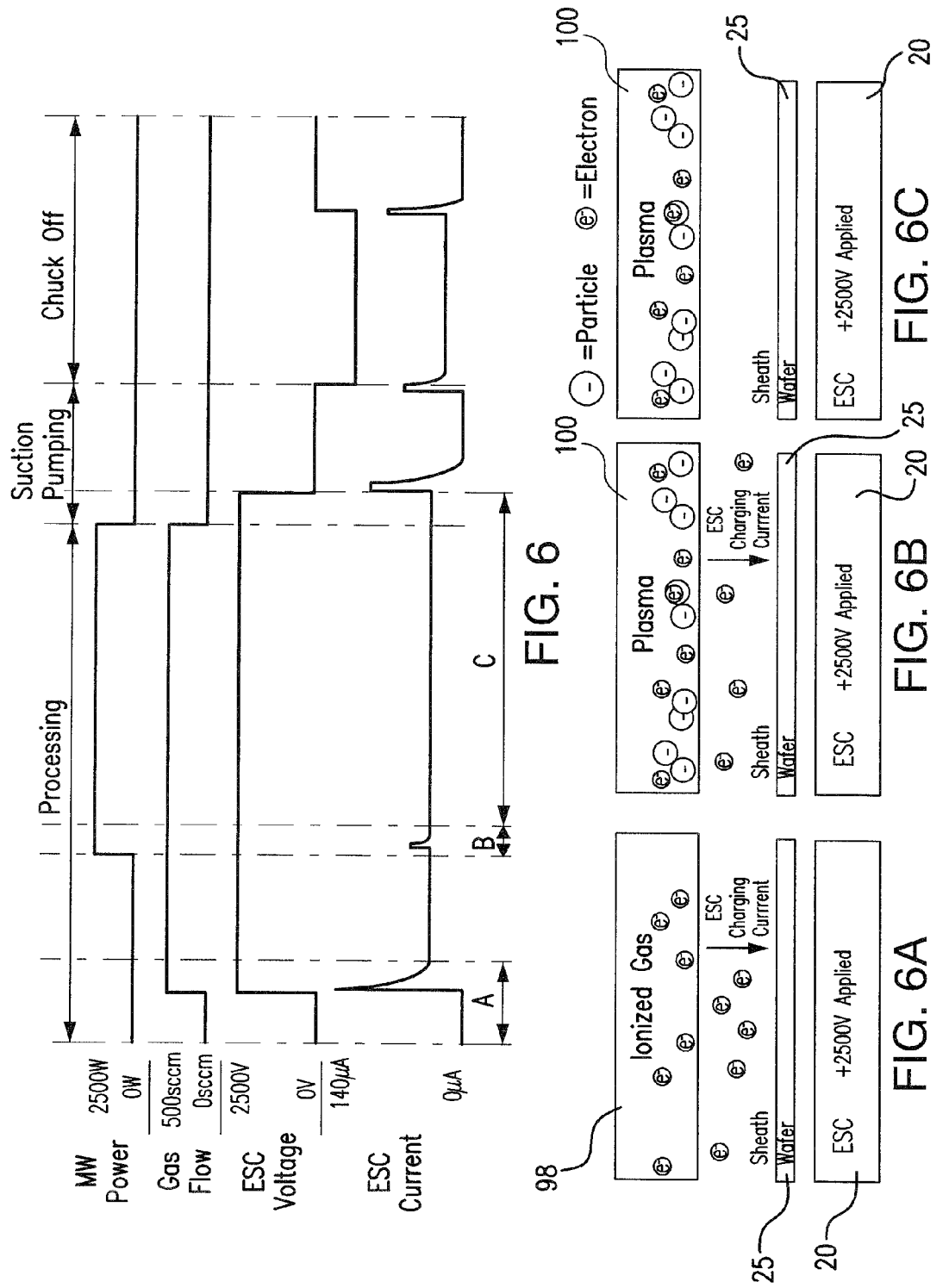

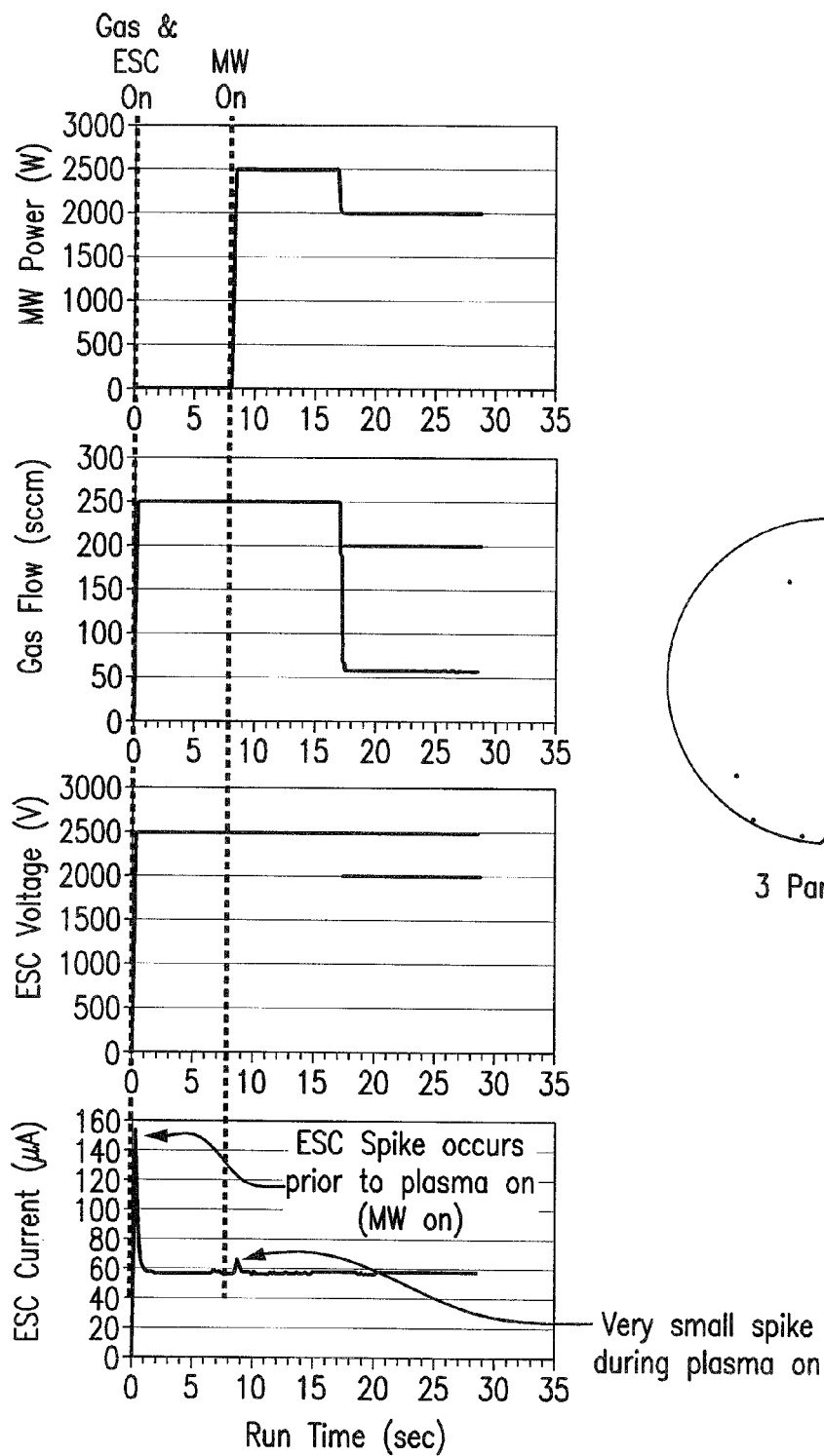
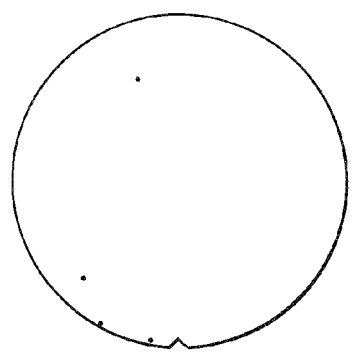
3 Particles
FIG. 7B

METHOD AND APPARATUS FOR ESC CHARGE CONTROL FOR WAFER CLAMPING

CROSS REFERENCE TO RELATED APPLICATION

This application claims priority to provisional application 62/028,919, filed Jul. 25, 2014, the entirety of which is incorporated herein by reference.

TECHNICAL FIELD

This invention relates to plasma processing, and particularly to a method and apparatus for processing a substrate using a plasma, while reducing the number of particles that may be deposited on a substrate during processing. The method and apparatus advantageously apply a voltage or charge to a wafer support or electrostatic chuck in a manner which reduces particle deposits.

BACKGROUND

During plasma processing, for example during plasma etching, particles can be generated within the plasma processing chamber. Such particles, if they should be deposited upon the wafer, are undesirable and can cause defects or diminish the quality or yield of the plasma processing.

SUMMARY

In accordance with the invention, the inventors have recognized that the deposit of particles on a substrate during plasma processing can be reduced by the manner in which power, and in particular, a DC bias power is applied to the electrostatic chuck.

BRIEF DESCRIPTION OF THE DRAWINGS

FIGS. 3, 3A, 3B and 3C illustrate a sequence of a conventional plasma process and the transfer of both electrons and particles to a wafer upon application of the ESC voltage;

FIGS. 4, 4A, 4B and 4C illustrate a processing sequence according a first example of an embodiment of the invention;

FIGS. 5A and 5B compare particles deposited during a conventional process as compared with an example of a process according to the invention;

FIGS. 6, 6A, 6B and 6C illustrate a process according to an alternate embodiment of the invention;

FIGS. 7A and 7B compare particle deposition according to a conventional process as compared with the alternate example of the invention;

DETAILED DESCRIPTION

Figure 1:
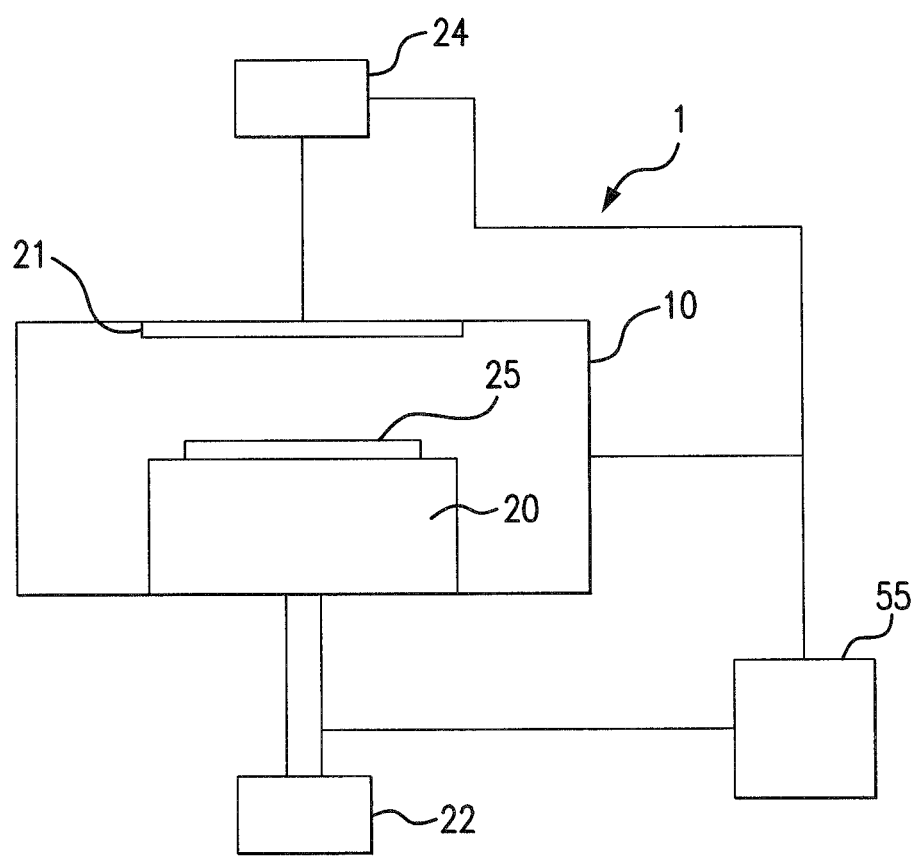
FIG. 1 schematically represents a plasma processing apparatus which can be utilized in accordance with the invention.

FIG. 1 schematically illustrates a plasma processing apparatus to which the present invention is applicable. In a particularly preferred form, the invention relates to methods and apparatuses for plasma etching, however the invention could also be applied to other types of plasma processing methods and equipment.

As shown in FIG. 1, the apparatus 1 includes a chamber 10, within which a wafer support 20 is provided supporting a wafer 25. The wafer support 20 includes an electrostatic chuck or ESC, and a DC power is applied by power supply represented at 22 for clamping and unclamping of a wafer. The assembly 20 can also function as an electrode, either as a powered electrode or as a ground electrode or both (for example, where power of two frequencies is applied, such as where an upper electrode is powered with one frequency and the lower electrode assembly 20 provides a ground path for that frequency, with another frequency power applied through the lower electrode and the upper electrode acting as a ground path for the frequency supplied from the lower electrode). An upper electrode is illustrated at 21, and the upper electrode can also provide a shower head through which gases for forming the plasma are injected. Power for generating the plasma is provided by a power source represented at 24 which can be, for example, a radio frequency power or microwave power, or power of other frequencies. Although the power source 24 is illustrated as connected to upper electrode 21, it is to be understood that the power for igniting and maintaining a plasma to process the wafer could be applied to the lower electrode 20, with the upper electrode 21 serving as a ground. Alternately, as discussed above, power could be applied to both the upper and lower electrodes 20, 21.

One or more controllers represented at 55 are provided for controlling the operations of the plasma processing apparatus 1. The controller(s) 55 can include, for example, one or more microprocessors. Suitable software can be programmed and stored in a suitable non-transitory medium to perform methods as described in further detail herein.

The above arrangement is provided as an example, and it is to be understood that the invention could be applied to alternate arrangements. For example, although a shower head arrangement is illustrated at 21 in the above arrangement, alternate gas injection methods could be utilized in addition to or as an alternative to the shower head arrangement, for example, with additional gas injection at side or other top locations of the chamber.

Figure 2B:
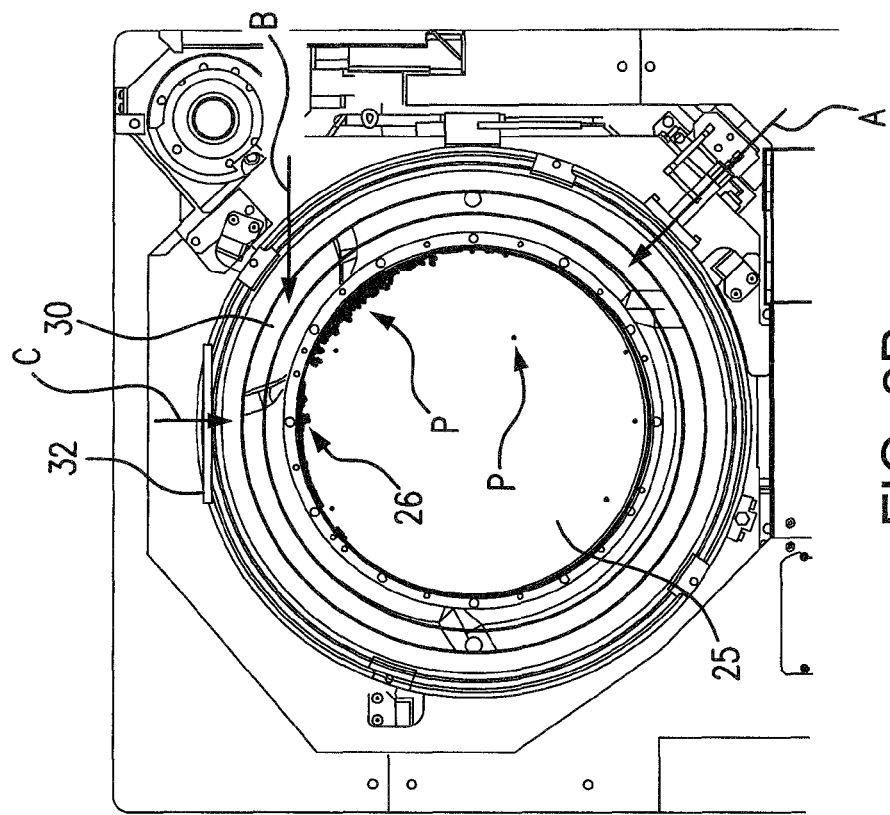
FIGS. 2A and 2B are examples showing particles deposited on a wafer in a plasma processing apparatus.
Figure 2A:
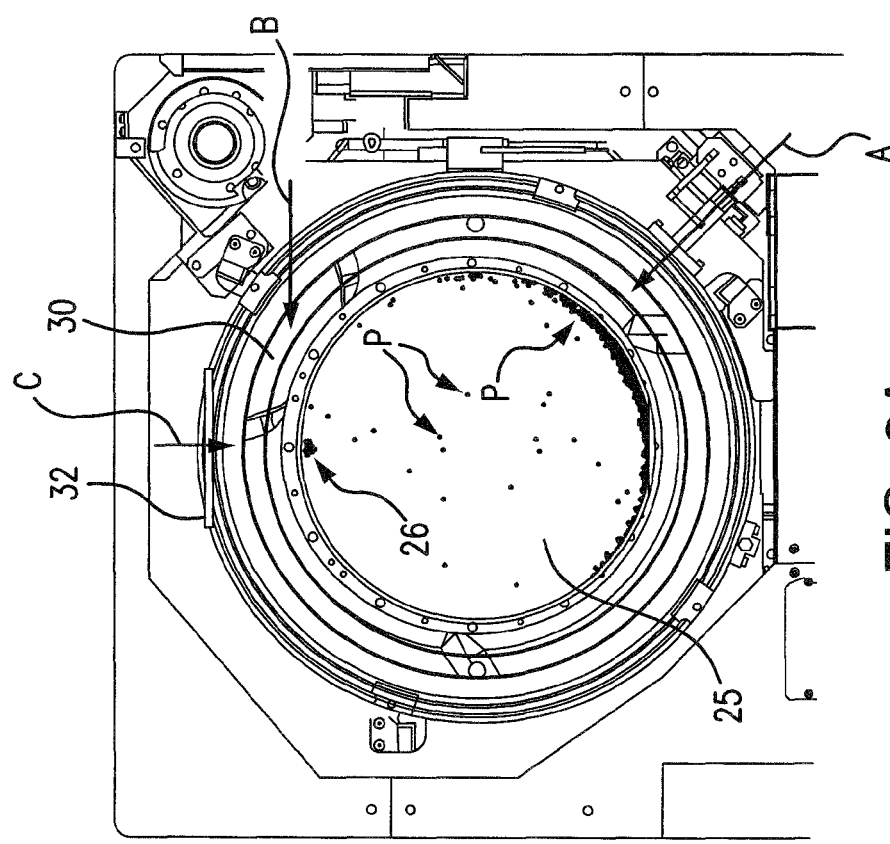

FIGS. 2A and 2B illustrate a plan view of a wafer 25 positioned within a processing apparatus, with particles that can be deposited on a wafer indicated at P. Such particles can be deposited at different locations, and sometimes can be concentrated at different locations, for example, at a location of a wafer notch 26 utilized for positioning or orientation of the wafer. Also by way of example, particles P can be concentrated at a location corresponding to a gas injection location indicated by arrow A, or near an exhaust location indicated by arrow B where gases are exhausted from the chamber through an exhaust port 30. In the arrangement of FIGS. 2A and 2B, in addition to a showerhead as shown at 21 in FIG. 1, process gases are also injected through a sidewall of the chamber as represented by arrow A. Wafers pass into the chamber in the direction indicated by arrow C, for example, by using a robot arm to insert wafers through a selectively openable shutter or gate valve schematically represented at 32.

The particles and particle patterns are illustrated in FIGS. 2A and 2B as examples. It is to be understood that the distribution of particles can vary depending upon the process or process conditions, and also there is a component of randomness to the generation of particles.

FIGS. 3, 3A, 3B and 3C illustrate a typical plasma processing sequence, and provides an illustration or explanation as to possible causes of particle deposition upon a wafer. During processing, the presence of particles within the plasma is virtually inevitable, and the key is to minimize deposition of such particles upon the wafer 25 during processing.

In the illustration of FIG. 3, the wafer 25 and ESC (electrostatic chuck) 20 are shown spaced from one another for ease of illustration, however, it is to be understood that during processing, the wafer 25 is positioned on the ESC 20. Also, in the illustration, the particles are represented at P corresponding to the larger circles with a "–" inside, and the plasma also includes free electrons E illustrated with the smaller circles having an "e–" inside.

FIG. 3 represents a time line of different operations during processing, with the corresponding regions time A, B, C in the lower portion of FIG. 3 respectively corresponding to the transfer electrons and/or particles during processing illustrated in FIGS. 3A, 3B and 3C.

During processing, initially the plasma power is applied, for example, at 2500 W in order to strike a plasma. This is illustrated in region A. During this time, the DC clamping voltage is not applied to the ESC. The wafer can be considered as in a floating state, or in other words, there is no bias biasing the transfer of current or charge from the plasma to the wafer and ESC resulting from voltage applied to the ESC as the voltage has not yet been applied. When the voltage is initially applied to the ESC, a large charging current spike occurs as indicated in region B, representing a transfer of current from the plasma to the wafer and the ESC, until the ESC becomes fully charged and reaches a steady state (representing resistive losses of the ESC circuit), at which point the wafer potential can be considered as floating or at a steady state potential as indicated by region C. Note that there are actually two components of current passing from the plasma. First there is current associated with the striking and maintaining of the plasma by one or more plasma power sources. Second, there is current from the ESC power supply, which causes current to flow from the plasma and charge the ESC. The current identified as the ESC charging current in FIG. 3B (and also FIGS. 4B, 6A and 6B discussed later herein) is the current charging the ESC, and not current associated the striking and maintaining of the plasma, as separate ground paths are provided for such currents according to their associated frequencies. It is also to be understood that after the ESC is charged or reaches "steady state" as discussed herein, there nevertheless remains a current passing from the plasma to the ESC resulting from the application of the ESC voltage as a result of resistance losses of the ESC circuit. It is believed that the current spike at the beginning of region B represents a significant or primary cause for the deposit of particles upon the wafer 25. Due to collection ions and electrons from the plasma, solid particles obtain a large negative charge. Although it is necessary for the current to be transferred to the wafer and the ESC in order to charge the wafer and ESC to steady state, it is preferable this is achieved by the transfer of electrons E, without transferring of charged particles P to the wafer. In accordance with an aspect of the invention, it has been recognized that reducing the intensity or magnitude of the current spike at the beginning of and during charging in the region B will reduce the quantity of particles transferred from the plasma to the wafer as the ESC is charged.

When a voltage is applied to the ESC, the ceramic coating of the ESC acts as a dielectric of a capacitor, and as the capacitor is charged current is flowing through the plasma to charge the capacitor, resulting in an electric field imparted to the wafer. In accordance with the present invention, Applicants have recognized that by reducing the magnitude of the current spike, the deposition of particles can be significantly reduced. In addition, according to an alternate embodiment discussed later, the reduction of particles can also be achieved by charging of the ESC (in whole or in part) prior to generation of the plasma.

Referring to FIG. 4, a process according to the invention is illustrated, together with corresponding illustrations as to the transfer of current from the plasma to the wafer and the ESC as the voltage is applied to the ESC.

In the example of an embodiment of the invention shown in FIG. 4, the voltage is applied by ramping the voltage in a step-wise manner so that the current spikes are smaller and the wafer and the ESC are preferably stabilized after each increment (or nearly stabilized) before the voltage is increased with another step-increase, until finally the desired voltage is achieved. In the example of FIG. 4, six step-wise increases are illustrated, however, it is to be understood that a greater or lesser number of step-wise increases could be utilized. For example, as many as one hundred step-wise increase could be used depending upon the equipment. Also, by way of example only, the duration of time of each step until the next increase can be from about 0.1 seconds to about one or two seconds, however, the duration of the steps could be smaller or larger. In this way, at least one intermediate voltage set point is used between the initial ESC voltage (typically zero) and a second ESC voltage set point or final desired voltage or charge level.

As shown in FIGS. 4, 4A, 4B and 4C during the ramping or application of the ESC DC voltage in the step-wise fashion, the magnitude of current spikes is significantly reduced. As a result, as the wafer and ESC are being charged, the instantaneous potential difference between the wafer and the plasma is lower, and the transfer of current from the plasma to the wafer and ESC is by way of the transfer of electrons rather than transfer of negatively charged contaminant particles (or with transfer deposition of particles reduced). As illustrated, after plasma processing is completed, the plasma generating power can be turned off to extinguish the plasma, the chamber can be pumped down, and the ESC can be turned off. As illustrated in FIG. 4, during the "Chuck Off" sequence, a negative DC voltage can be applied to the ESC for de-clamping of the wafer, followed by turning off of the voltage to the ESC.

In the illustrated example, the final desired ESC voltage is 2500 volts. However, this voltage could vary and the final desired voltage for clamping or biasing the ESC could be, for example, 100-5000 volts (preferably 500-5000 volts).

FIG. 5 compares examples with corresponding measured particle counts of a conventional process as compared with a process according to the invention. In the arrangement of FIG. 5A, the voltage is illustrated by the upper line of the graph, while the lower line of the graph illustrates the current. As discussed earlier, with a conventional process, a large current spike is observed as the voltage is applied. In this example (FIG. 5A), a large number of particles were observed, with 247 particles observed and distributed as shown in the lower portion of FIG. 5A.

In the example of FIG. 5B, the voltage was increased in 10 steps, with a duration of 0.6 seconds for each step. In other words, a preselected time interval elapses from one voltage increase until the next voltage increase commences, with the time interval 0.6 seconds in the example illustrated. However, as noted earlier, the number of steps and the duration or interval of each step can be varied. In the example of FIG. 5B, a dramatic reduction in particles was observed, so that only two particles were observed using the step-wise increase of voltage to achieve the final desired voltage.

FIGS. 6, 6A, 6B and 6C illustrate an alternate embodiment of the invention. In the embodiment of FIG. 6, the voltage is applied to the ESC prior to generation of the plasma as illustrated in region A of FIG. 6 and represented in FIG. 6A. As a result, there will be a breakdown of gases within the chamber as a result of the voltage applied to the ESC, and electrons will pass from the ESC induced broken down gas or ionized gas (or in other words charges from the breakdown or ionization of gases). FIG. 6 refers to the ESC induced ionized gas represented at 98 corresponding to gases which are broken down with a weak DC discharge, however this is prior to generation of the contaminant particle rich processing plasma, and this is not a plasma utilized for processing (e.g., for performing an etching operation) of the wafer. As shown in FIG. 6, although there is a current spike upon application of the voltage to the ESC, this occurs prior to generation of the processing plasma, and therefore, there are no particles (or minimal particles) to be transferred to the wafer, and thus the current transferred to the wafer and charging of the ESC is accomplished by free electrons without depositing (or with minimal depositing) of particles upon the wafer. After the ESC is charged, the plasma generating power is applied to strike a plasma in region B shown in FIG. 6 and FIG. 6B. Although a current spike will also occur upon application of the plasma generating power, as illustrated in FIG. 6, such a spike is minimal.

Figure 7A:
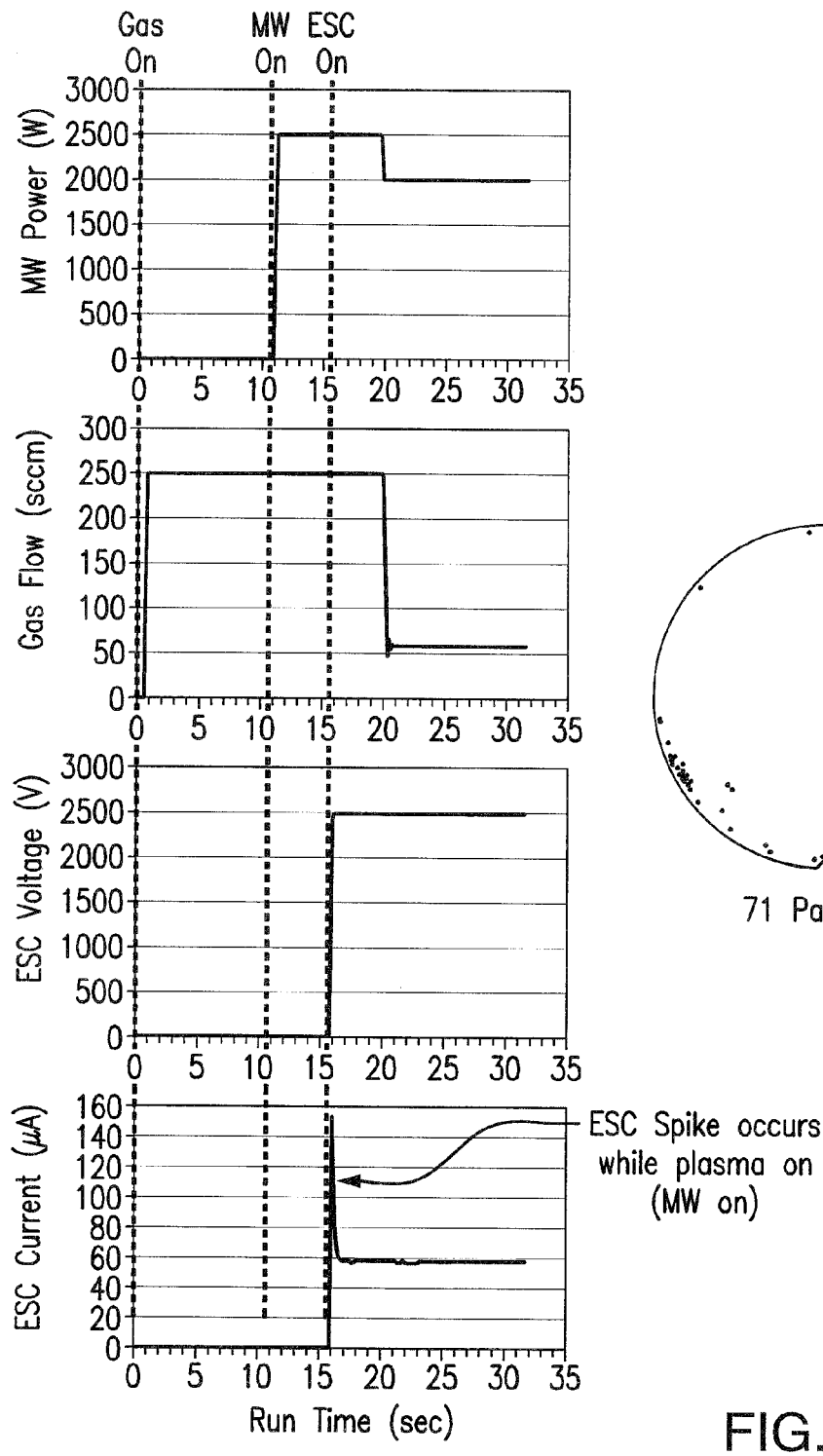

FIGS. 7A and 7B illustrate a comparison of particle deposits of the embodiment of FIG. 6 compared with a conventional process. In particular, FIG. 7A illustrates a conventional process in which the voltage is applied to the ESC after striking of the processing plasma. In this example, 71 particles were observed.

By contrast, in accordance with an example of the invention as illustrated in FIG. 7B, by applying the voltage to the ESC prior to striking of the processing plasma, the particles deposited on the wafer were significantly reduced, with only three particles observed.

It is to be understood that variations of the invention are also possible. For example, a portion of the final desired ESC voltage could be applied prior to striking of the plasma, with the voltage increased after striking of the plasma in one or more steps. With such a modification, the spiking of current while the processing plasma is present is also reduced, to thereby reduce particles deposited on the wafer.

Figure 8:
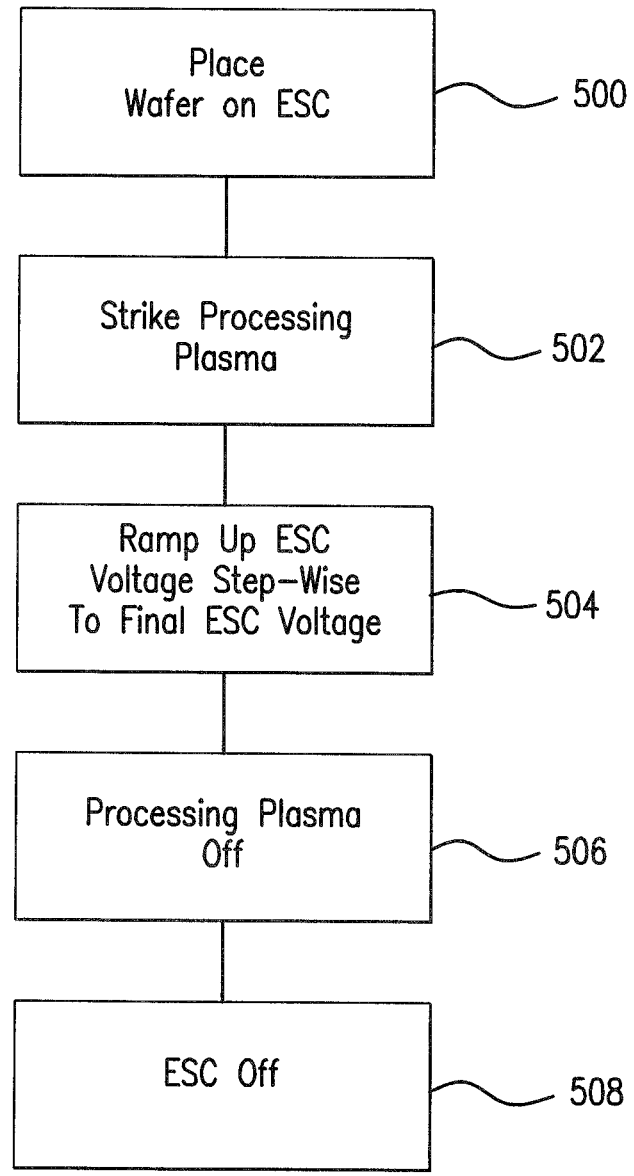
FIG. 8 is a flow chart illustrating the first example of an embodiment of the invention.

FIG. 8 is a flow chart or algorithm corresponding to a method of the first embodiment described earlier herein. Such an algorithm can be programmed in software stored in a suitable memory medium and carried out by one or more controllers as represented at 55 in FIG. 1. Such a computer readable medium can include various types of memory such as a flash memory, a memory card or disk, or various other types of memory such as, by way of example, magnetic, ferroelectric, hard disks, optical disks, or various forms of non-volatile memory [NVM] devices. As shown in FIG. 8, and also illustrated in the corresponding FIG. 4 discussed earlier herein, initially the wafer is placed on the ESC as shown in step 500. Thereafter, as shown in step 502, the plasma generating power is applied to strike the plasma. In step 504, the ESC voltage is applied in a step-wise manner so that the ESC voltage is ramped-up to the final desired ESC voltage. As discussed earlier, preferably this is achieved in a series of stepped increases with an interval of time occurring between stepped increases, for example, an interval of 0.1-2 seconds for each step increase in voltage. After the processing of the wafer is completed, the processing plasma power is turned off in step 506. As illustrated in FIG. 4, following plasma processing, the chamber is pumped down to remove remaining process gases, and at step 508, the ESC voltage is turned off.

Figure 9:
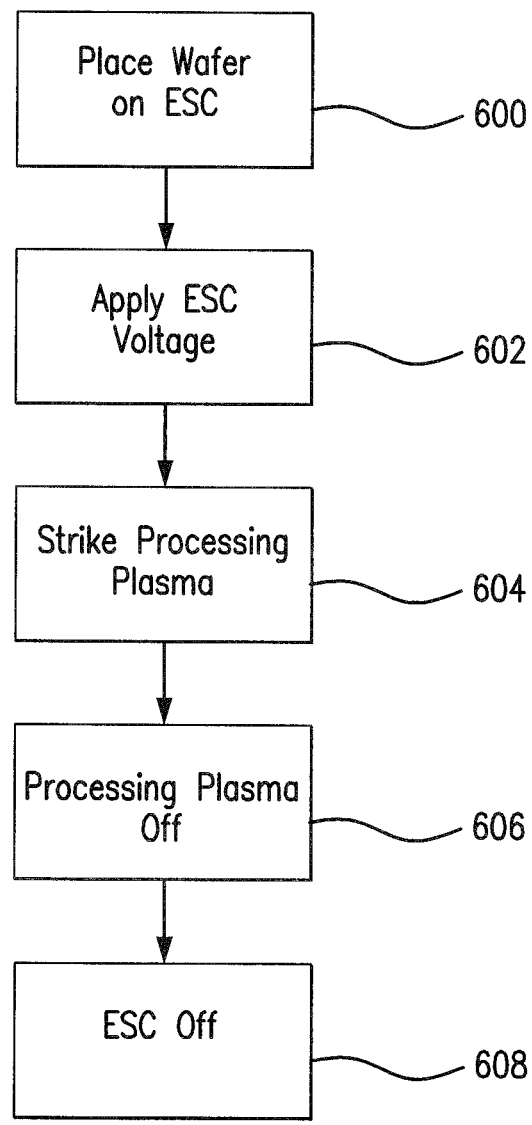
FIG. 9 is a flow chart of the alternate example of an embodiment of the invention.

FIG. 9 provides a flow chart or algorithm corresponding to the second example described earlier herein in conjunction with FIG. 6. The wafer is initially placed on the ESC as shown in step 600. Thereafter, the ESC voltage is applied, at step 602, but prior to striking of the processing plasma in step 604. Thereafter, after processing of the wafer is completed, the processing plasma power is turned off, in step 606. After pumping down of the chamber, the ESC is turned off in step 608.

Although the invention is described with reference to various examples, it is to be understood that variations and modifications are possible. Accordingly, it is to be understood that within the scope of the appended claims, the invention can be practiced other than as described according to specific examples herein.

What is claimed:

1. A method for treating a substrate, comprising:
   receiving the substrate in a plasma processing chamber comprising an electrostatic chuck (ESC);
   igniting a plasma in the plasma processing chamber;
   applying, after igniting the plasma, an ESC voltage to the ESC, with the ESC voltage increasing in a step-wise manner from a first set point that includes a first voltage magnitude to a second set point that includes a second voltage magnitude using at least one intermediate set point disposed between the first set point and the second set point, the intermediate set point including an intermediate voltage magnitude between the first and second voltage magnitudes; and
   etching the substrate using the plasma.

2. The method of claim 1, wherein the ESC voltage ramping comprises:
   providing a substantially equal amount of time provided for each voltage increase; and
   a substantially similar difference in voltage between the first set point and each of the subsequent intermediate set points or the intermediate set point, and between the intermediate set points or the intermediate set point and the second set point.

3. The method of claim 2, wherein the voltage to the ESC is increased in the step-wise manner, with each applied voltage maintained at a constant voltage for a period of from 0.1 seconds to 2.0 seconds prior to a next voltage increase.

4. The method of claim 3, wherein the step-wise voltage increases comprise no more than one hundred steps in voltage between the first set point and the second set point.

5. The method of claim 1, wherein the second set point comprises a magnitude of no more than 5000V.

6. The method of claim 1, wherein the second set point comprises a magnitude of at least 500V.

7. The method of claim 1, wherein the plasma processing chamber comprises a microwave power source to enable the ignition of the plasma.

8. The method of claim 1, wherein the plasma processing chamber comprises a radio frequency power source to enable the ignition of the plasma.

9. A method for treating a substrate, comprising:
   receiving the substrate in a plasma processing chamber comprising an electrostatic chuck (ESC);
   igniting a plasma in the plasma processing chamber;
   charging the ESC in a step-wise manner using at least three different successively increasing charge magnitudes, wherein each successive charge increase is maintained at a constant voltage for a predetermined period of time before the next charge increase; and
   etching the substrate using the plasma.

10. The method of claim 9, wherein the charging comprises applying a voltage to the ESC such that electrons are pulled from the plasma to the substrate.

11. The method of claim 9, wherein the predetermined period is in a range of from 0.1-2.0 seconds.

12. The method of claim 9, wherein the charging comprises creating a potential difference that attracts a first type of negatively charged particle more than a second type of negatively charged particle due to higher mobility of the first type of negatively charged particle.

13. The method of claim 12, wherein the plasma comprises the second type of negatively charged particle and the first type of negatively charged particle, wherein the first type of negatively charged particles are electrons and the second type of negatively charged particles are solid contaminant particles.

14. The method of claim 9, wherein the charging of the ESC includes increasing a voltage applied to the ESC in a step-wise manner until a final ESC voltage is reached.

15. The method of claim 9, wherein the igniting of the plasma occurs after at least partial charging of the ESC.

16. A method for treating a substrate, comprising:
 receiving the substrate in a plasma processing chamber comprising an electrostatic chuck (ESC);
 applying an ESC voltage to the ESC;
 igniting a plasma in the plasma processing chamber after applying the ESC voltage; and
 etching the substrate using the plasma.

17. The method of claim 16, wherein the applying of the ESC voltage comprises changing the ESC voltage from an initial set point to a final set point that is used during etching of the substrate.

18. The method of claim 16, wherein the applying of the ESC voltage comprises ramping the ESC voltage from a first set point to a second set point using at least one intermediate set point disposed between the first set point and the second set point.

19. The method of claim 18, wherein the ESC voltage ramping comprises:
 providing a substantially equal amount of time provided for each voltage increase; and
 a substantially similar difference in voltage between the first set point and each of the subsequent intermediate set points or the intermediate set point, and between the intermediate set points or the intermediate set point and the second set point.

20. The method of claim 19, wherein the voltage to the ESC is increased in a step-wise manner, with each applied voltage maintained at a constant voltage for a period of from 0.1 seconds to 2.0 seconds prior to a next voltage increase.

* * * * *